(12) United States Patent
Hashimoto

(10) Patent No.: US 6,392,947 B1
(45) Date of Patent: May 21, 2002

(54) SEMICONDUCTOR MEMORY DEVICE

(75) Inventor: Masashi Hashimoto, Tsukuba (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/186,315

(22) Filed: Nov. 4, 1998

(30) Foreign Application Priority Data

Nov. 5, 1997 (JP) ............................................. 9-302843

(51) Int. Cl.[7] .................................................. G11C 7/00
(52) U.S. Cl. ........................................ 365/220; 365/238
(58) Field of Search ................................... 365/220, 238

(56) References Cited

U.S. PATENT DOCUMENTS 4,303,986 A * 12/1981 Lans ...................... 365/230.01
5,317,540 A * 5/1994 Furuyama .............. 365/230.01

* cited by examiner

Primary Examiner—Terrell W. Fears
(74) Attorney, Agent, or Firm—William B. Kempler; Frederick J. Telecky, Jr.

(57) ABSTRACT

To efficiently access pixel data stored in memory in the X direction and Y direction when carrying out error correction processing. In a data output section 10, a pixel block consisting the desired 2×2 pixel data W1–W4 is selected by inputting a address, and pixel data continuously aligned in an arbitrary direction, that is, in the X direction or Y direction, are output inputting output pixel selection signals V1 and V2. Specifically, two pixels W1, W2, or W3, W4, which are continuously aligned in the X direction, are selected when signals V1 and V2=0 and V1=0 and V2=1, and two arbitrary pixels W1, W3 or W2, W4, which are continuously aligned in the Y direction, are selected when signal V1=1 and V2=0 and V1 and V2=1.

13 Claims, 12 Drawing Sheets

| V1 | V2 | W1 | W2 | W3 | W4 |
|----|----|----|----|----|----|
| 0  | 0  | 1  | 1  | 0  | 0  |
| 0  | 1  | 0  | 0  | 1  | 1  |
| 1  | 0  | 1  | 0  | 1  | 0  |
| 1  | 1  | 0  | 1  | 0  | 1  |

SEMICONDUCTOR MEMORY DEVICE

FIELD OF THE INVENTION

The present invention relates to a semiconductor memory device that is suitable for storing data having a two-dimensional structure, such as, for instance, image data, and is capable of efficiently reading out stored image data in an arbitrary, vertical or horizontal direction.

BACKGROUND OF THE INVENTION

In equipment processing digital data, such as DVD (Digital Video Disc), and the like, errors produced by noise during information reproduction and transfer are eliminated by using ECC (Error Correction Coding) protocols. In error detection and correction, redundant components are attached to transferred information and detection and correction of errors is carried out by using these redundant components. The Reed Solomon code, which has a good code efficiency and a high error correction capability, is used in DVD and such.

In the error correction code used in DVD, in order to further increase the error correction capability, information is divided into blocks of predetermined size, the information in block form is mapped to a mathematical two-dimensional space (XY space), and redundant code (Reed Solomon code) independent in two directions, the X direction and the Y direction, is attached.

For this reason, in order to effect encoding by attaching redundant code to the information to be recorded during data recording, as well as in order to carry out error correction processing on the reproduced information during data reproduction to effect decoding of correct information, independent calculations are carried out, respectively, in the X direction and Y direction.

Specifically, for instance, in the case of recording data to a DVD, once the write data have been stored in memory, by using the data stored in memory, data are read out by scanning in the X direction and Y direction, and error correction code is generated. Then, data used for recording are generated by combining the generated error correction code and initial write data and are recorded to the DVD.

Also, in the case of reproducing data from a DVD, once the reproduced data have been stored in memory, by using the data stored in memory, readout is carried out by scanning in the X direction and Y direction, and error correction code is generated. Then, it is determined whether the reproduced data are correct by comparing the generated error correction code with the reproduced error correction code, and when there is an error, error correction processing is carried out.

Incidentally, when such error correction processing is carried out, the problem is that processing cannot be efficiently carried out in the case of using current memories (semiconductor memory devices).

As was described above, when error correction processing is carried out, when data subject to processing are input, scanning of the data is carried out in the X direction and Y direction, and calculations are performed on the read-out data. When recording data to ordinary memory, however, in many cases a plurality of data are packaged and recorded as a single word, and the problem with such a case is that efficient access is impossible in both the X direction and the Y direction.

For instance, when data are stored in memory, usually, this is carried out by words constituting units of 8 bits, 16 bits, 32 bits, etc. On the other hand, with image data, a single pixel data element is in many cases represented by 1 bit, 2 bits, 4 bits, 8 bits, and the like. In such a case when, for instance, a single pixel data element is four bits, then in many cases one word is composed of 8-bit or 16-bit data made up of data of 2 pixels or 4 pixels continuously aligned, for example, in the X direction, and it is recorded to memory as a unit.

Then, in such a case, when carrying out error correction processing by reading out successive data in the X direction, each time data of a single word are read out, the necessary successive data of two pixels or four pixels are read out without any problem, but should error correction processing be carried out by reading out successive data in the Y direction, in a single word, there is only one element of the necessary pixel data, and, in addition to the necessary data, excessive data of one pixel or three pixels continuously aligned with this data in the X direction are necessarily included therein. Therefore, the frequency of memory access when carrying out error correction processing by scanning in the Y direction is two or four times as high as the frequency of memory access in the case of carrying out error correction processing by scanning in the X direction, which of course results in a corresponding increase in processing time.

Therefore, the object of the present invention is to provide a semiconductor memory device capable of efficiently and rapidly accessing continuously aligned data in both the X direction and Y direction when storing data having a two-dimensional structure, such as when each data element is specified by a position in the X direction and Y direction, for example, capable of efficiently carrying out processing of excess [sic] correction code generation with respect to stored image data.

SUMMARY OF THE INVENTION

In order to solve the above-mentioned problems, data of NxN pixels in the X direction and Y direction are recorded to the same simultaneously accessible page or word of memory, and, after simultaneously accessing them, the data of the desired N pixels continuously aligned in the X direction and Y direction can be selected and output.

Therefore, the semiconductor memory device of the present invention has a storage means for storing data having a two-dimensional structure, in which each data element is specified by a position in a first direction and a position in a second direction, and an output means for substantially simultaneously reading out and outputting a plurality of predetermined above-mentioned data aligned in a desired direction, that is, either in the above-mentioned first direction or the above-mentioned second direction, from the above-mentioned stored data having a two-dimensional structure.

Appropriately, the above-mentioned storage means stores the above-mentioned data having a two-dimensional structure so that they can be simultaneously read out in N blocks having N×N data elements in the above-mentioned first direction and the above-mentioned second direction, with the above-mentioned output means having a block designation means for designating the desired above-mentioned blocks in the above-mentioned stored data having a two-dimensional structure, a data reproduction means for reproducing N×N data elements. of the above-mentioned designated blocks, a data designation means for designating N data elements of a single type in N data elements of 2×N types aligned in the above-mentioned first direction or second direction which are contained in the above-mentioned read-out blocks, a data selection means for selecting the above-mentioned designated N data elements in the above-mentioned read-out NxN data elements, and N data output means for outputting the above-mentioned selected N data elements.

Specifically, the above-mentioned data selection means has an N×N output control means provided for each of the above-mentioned reproduced N×N data elements, connected to each of the above-mentioned N data output means in such a manner that all of the data that are not in the same column in the above-mentioned first direction and the above-mentioned second direction are all connected to the same above-mentioned data output means, and that controls the output of each of the above-mentioned reproduced data elements with the above-mentioned output control means, which corresponds to the above-mentioned designated N data elements, selecting the above-mentioned designated N data elements from the above-mentioned read-out N×N data elements by outputting the corresponding data to the above-mentioned connected data output means.

Also, specifically, the above-mentioned data selection means has N×N control means provided for each of the above-mentioned reproduced N×N data elements and controls the output of the above-mentioned reproduced data based on the designation of the above-mentioned output N data elements, and a data switching means for arranging the N data elements selectively output from the above-mentioned NxN control means so as to generate data in a mutually predetermined positional relationship with respect to the above-mentioned first direction and the above-mentioned second direction and outputting them to the above-mentioned N data output means.

Specifically, the above-mentioned data are represented by a predetermined number of bits, the above-mentioned data having a two-dimensional structure are image data, and the above-mentioned data elements are pixel data of the above-mentioned image data.

BRIEF DESCRIPTION OF THE DRAWINGS

FIG. 4 is a diagram showing the relationship between the output pixel selection signals V1 and V2 input to the data output section shown in FIG. 3 and the selected pixel data W1–W4.

REFERENCE NUMERALS AND SYMBOLS AS SHOWN IN THE DRAWINGS

In the figures, 10 represents a data output section, 11 a Sense amp, 12 an output gate, 13 a XOR element, 14–17 inverter elements, 18 an AND element, 21 a first data I/O line, 22 a second data I/O line, 30 a data output section, 31 a sense amp, 32 an output gate, 33 a logic element group, 34 an AND element, and 41–44 data I/O lines.

DESCRIPTION OF THE EMBODIMENTS

Preferred Embodiment 1

A first embodiment of the present invention is explained with reference to FIGS. 1–7.

In the embodiments, explanations are provided with respect to a semiconductor memory based on the present invention, with explanations omitted, however, for the configuration of the data storage section, data storage elements, data storage method, and the like due to their being identical to those of ordinary semiconductor memories; concerning the output section that accesses and output data that have been already recorded, its configuration is shown, and its data output method is explained in detail.

Also, in the embodiments, a case in which image data are recorded to the semiconductor memory and, in order to generate error correction code for these image data, these stored image data are successively read out in the horizontal direction (X direction), as well as in the vertical direction (Y direction) is cited as an example, and explanations are provided regarding its data output method.

First of all, explanations are provided regarding the semiconductor memory of the embodiment.

The semiconductor memory of the embodiment is a DRAM with an I/O data width of 8 bits. Inside, it has a configuration in which a plurality of blocks having four sub-blocks with a width of 4 bits are provided. During data writing, based on designated word addresses, the input 8-bit data are stored at the same page address of two sub-blocks among the four sub-blocks of a desired block. During data readout, the desired 8-bit data can be read out by designating word addresses in the same manner. In this semiconductor memory, however, four elements of 4-bit data output from the four sub-blocks can be read out in predetermined combinations as another readout mode. At such time, the storage areas where four sub-blocks are simultaneously accessed have the same page address.

Hereinafter, explanations are provided regarding the readout method based on this mode.

Figure 1:
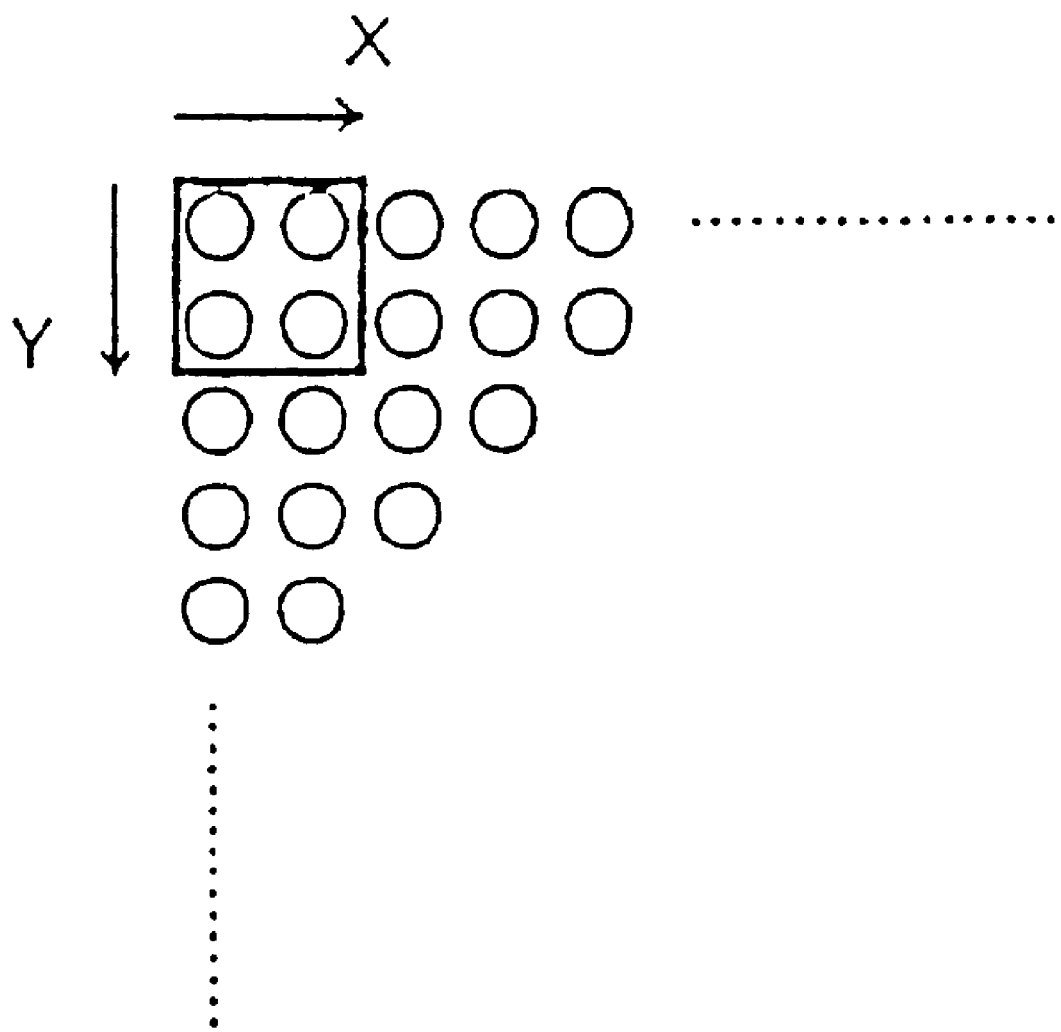
FIG. 1 is a diagram used for the explanation of image data stored in the semiconductor memory of Preferred Embodiment 1 of the present invention.

First of all, image data consisting of pixel data arranged in two dimensions, as shown in FIG. 1, are recorded to the semiconductor memory.

Each pixel is specified by the coordinates showing its position in the horizontal direction (X direction) and vertical direction (Y direction). Also, each pixel data element is represented by four bits.

Figure 2:
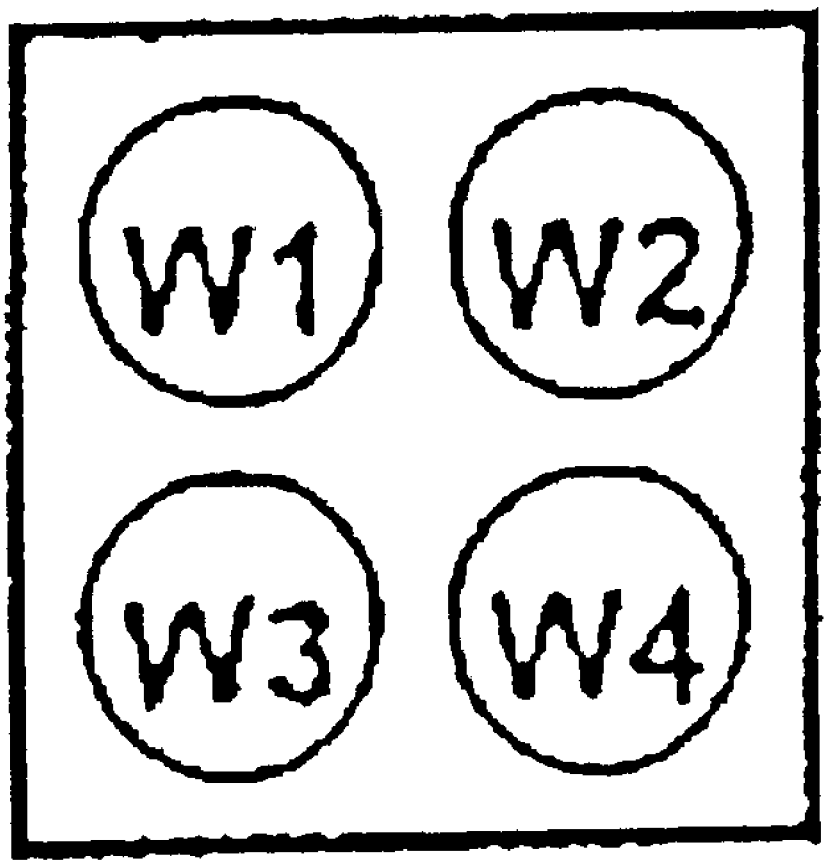
FIG. 2 is a figure used for the explanation of the elemental pixel data in a pixel block shown in FIG. 1.

As shown in FIG. 1, such image data are successively split into pixel blocks made up of four pixels, with 2×2 pixels in each, starting from the upper left corner X=0, Y=0, and stored in such a manner that the four pixel data elements of each pixel block are stored in four sub-blocks and the four pixel data elements of the same pixel block are stored in the storage area with the same page address. In addition, in the following explanations, the pixels in the 2×2 pixel blocks are represented with W1–W4 as illustrated in FIG. 2.

Explanations are now provided regarding the method of successively reading out pixel data in the horizontal direction and vertical direction from a semiconductor memory, in which image data are stored in this manner.

Figure 3:
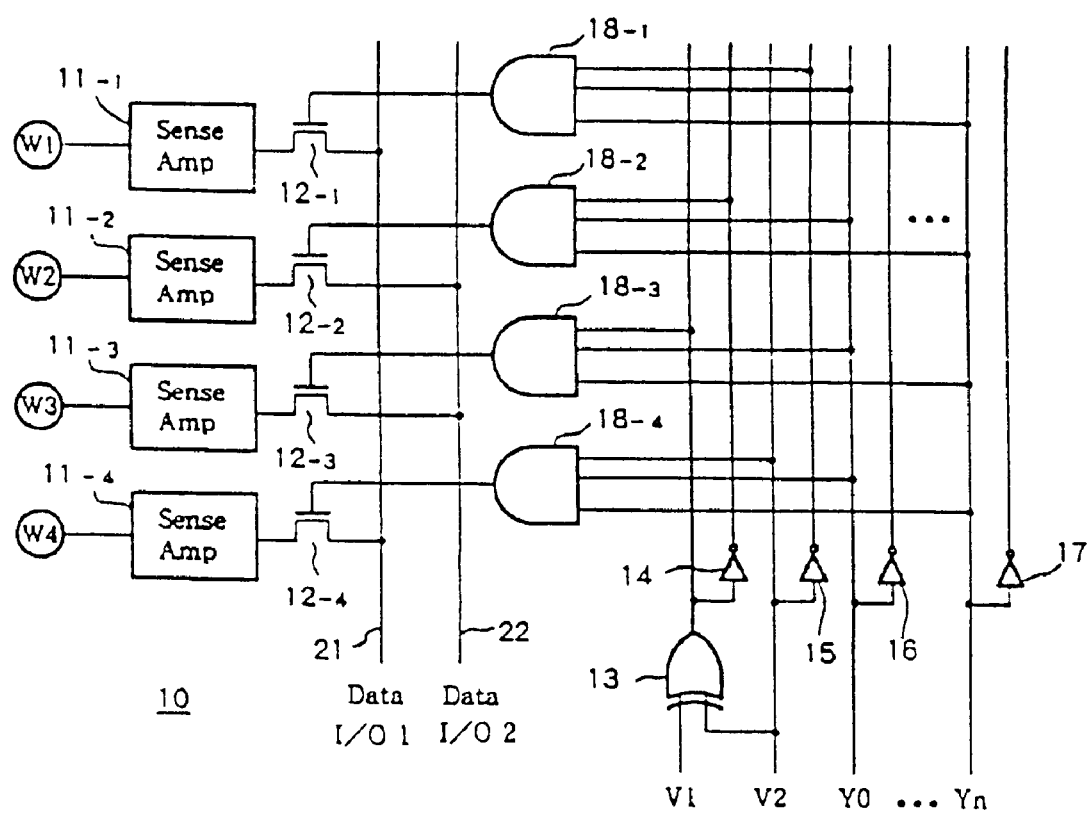
FIG. 3 is a circuit diagram showing the configuration of the data output section of the semiconductor memory of Preferred Embodiment 1.

First of all, explanations are provided with respect to the configuration of the data output section of the semiconductor memory of the embodiment with reference to FIG. 3.

FIG. 3 is a circuit diagram showing the configuration of the data output section of the semiconductor memory of the embodiment.

As shown in FIG. 3, the data output section 10 of the semiconductor memory of the embodiment has first-fourth sense amps $11_{-1}$–$11_{-4}$, first-fourth output gates $12_{-1}$–$12_{-4}$, XOR element 13, four inverter elements 14–17, four AND elements $18_{-1}$–$18_{-4}$, a first data I/O line 21 and a second data I/O line 22.

The first-fourth sense amps $11_{-1}$–$11_{-4}$ are provided for each above-described four sub-blocks and amplify the outputs from each accessed 4-bit storage element in the sub-blocks. In addition, in FIG. 3, the signals of W1–W4 with respect to the sense amps $11_{-1}$–$11_{-4}$ are 4-bit data output from each of the four sub-blocks, and are pixel data with the same reference keys in the pixel block shown in FIG. 2. Also, each the pixel data elements W1–W4 output to the first-fourth sense amps $11_{-1}$–$11_{-4}$ is data of an arbitrary pixel block of image data recorded to the semiconductor memory, which are read out from the sub-blocks based on the page address signals Y0–Yn input to the semiconductor memory.

The first-fourth output gates $12_{-1}$–$12_{-4}$ are provided for each of the first-fourth sense amps $11_{-1-11-4}$ and control the output of the data amplified by the sense amps $11_{-1}$ (i=1–4) to the first data I/O line 21 or second data I/O line 22 based on the control signals generated by the AND elements $18_{-1}$–$18_{-4}$, which will be described later. As shown in the figure, a pixel data element W1 output via the first output gate $12_{-1}$ is output to the first data I/O line 21, a pixel data element W2 output via the second output gate $12_{-2}$ is output to the second data I/O line 22, a pixel data element W3 output via the third output gate $12_{-3}$ is output to the second data I/O line 22, and a pixel data element W4 output via the fourth output gate $12_{-4}$ is output to the first data I/O line 21.

The XOR element 13, four inverter elements 14–17, as well as four AND elements $18_{-1-18-4}$ constitute a logic circuit for selecting and actuating either two of the four output gates $12_{-1}$–$12_{-4}$ based on the input page addresses Y0–Yn as well as output pixel selection signals V1 and V2.

The page addresses Y0-Yn constitute the upper portion of the page addresses input to the semiconductor memory. Upon decoding the addresses, for which data are output to the first-fourth sense amps $11_{-1-11-4}$, logic signals allowing the AND elements $18_{-1}$–$18_{-4}$ to become active are input to the AND elements $18_{-1}$–$18_{-4}$. Therefore, logic with respect to the page addresses Y0–Yn becomes the same regarding the four AND elements $18_{-1}$–$18_{-4}$ corresponding to the sub-blocks of the same block.

Figure 5:
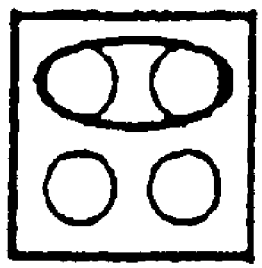
FIG. 5 is a diagram schematically showing the relationship shown in FIG. 4.
Figure 5:
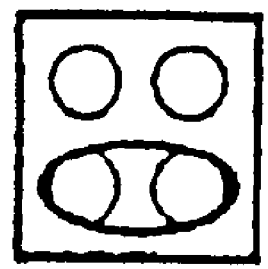
Figure 5:
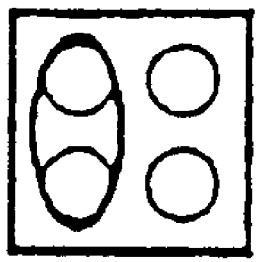
Figure 5:
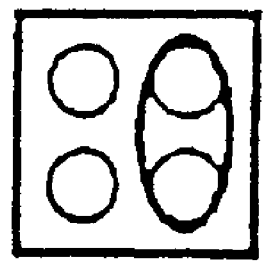

The output pixel selection signals V1 and V2, signals used for designating which two pixel data elements from among the four pixel data elements, such as those shown in FIG. 2 and designated by the page address, are output, with the relationship between the signal value and the selected pixel data shown in FIG. 4 and FIG. 5.

As shown in FIG. 4 and FIG. 5, pixel data W1, W2, which are two pixels in the horizontal direction on the upper side of the four pixels, are selected when signals V1 and V2 are both 0, pixel data W3, W4, which are two pixels in the horizontal direction on the bottom side of the four pixels, are selected when signal V1=0 and V2=1, pixel data W1, W3, which are two pixels in the vertical direction on the left side of the four pixels, are selected when signal V1=1 and V2=0, and pixel data W2, W4, which are two pixels in the vertical direction on the right side of the four pixels, are selected when signals V1 and V2 are both 1.

Then, the XOR element 13, the four inverter elements 14–17, as well as the four AND elements $18_{-1}$–$18_{-4}$ are elements constituting a specific circuit for selecting and actuating either two of the four output gates $12_{-1}$–$12_{-4}$ based on the input page addresses Y0-Yn as well as output pixel selection signals V1 and V2.

If a data output section 10 of such a configuration is used, first of all, a desired pixel block is designated by inputting a page address to the semiconductor memory, and pixel data continuously aligned in an arbitrary direction, that is, either the X direction or the Y direction, can be output by inputting the output pixel selection signals V1 and V2.

Figure 6:
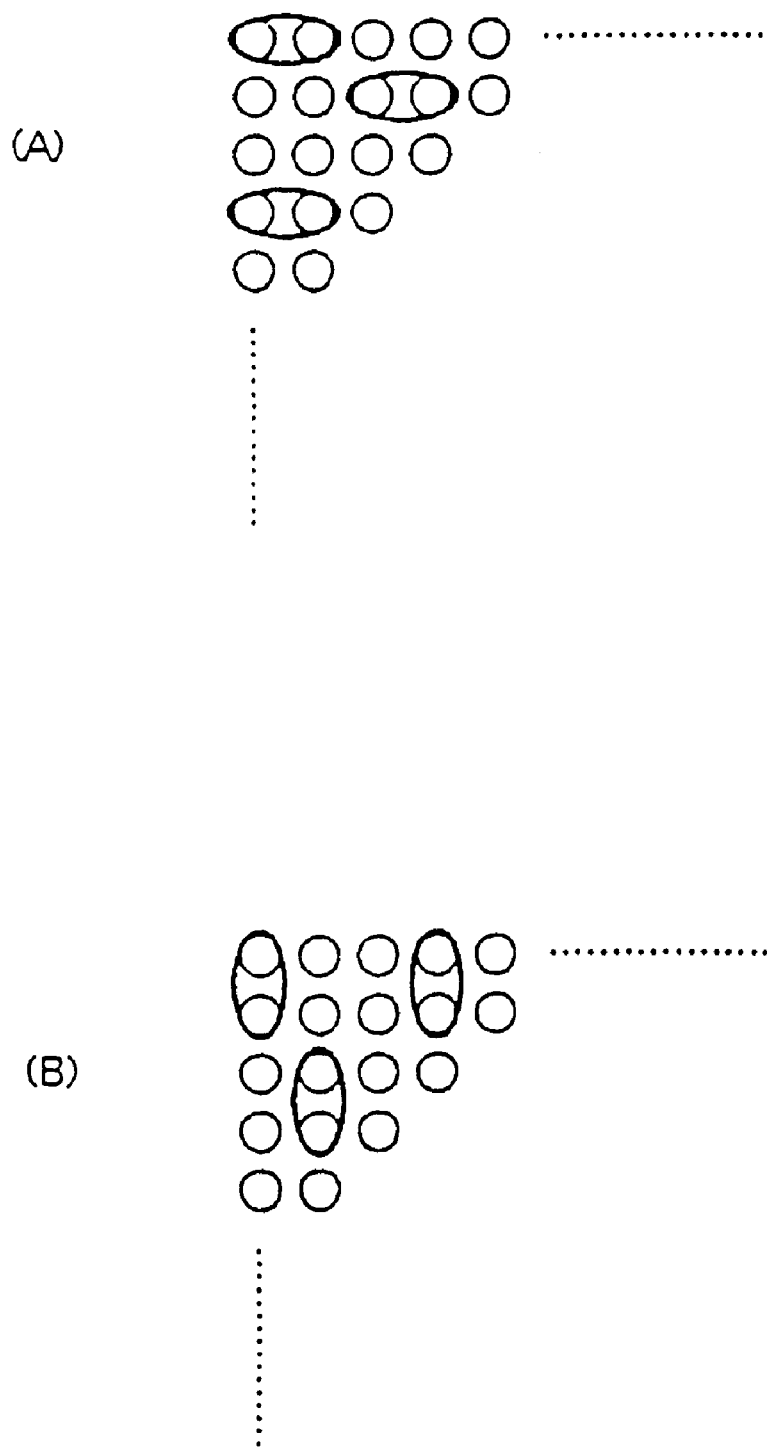
FIG. 6 is a diagram showing pixel data output via the data output section shown in FIG. 3.
Figure 7:
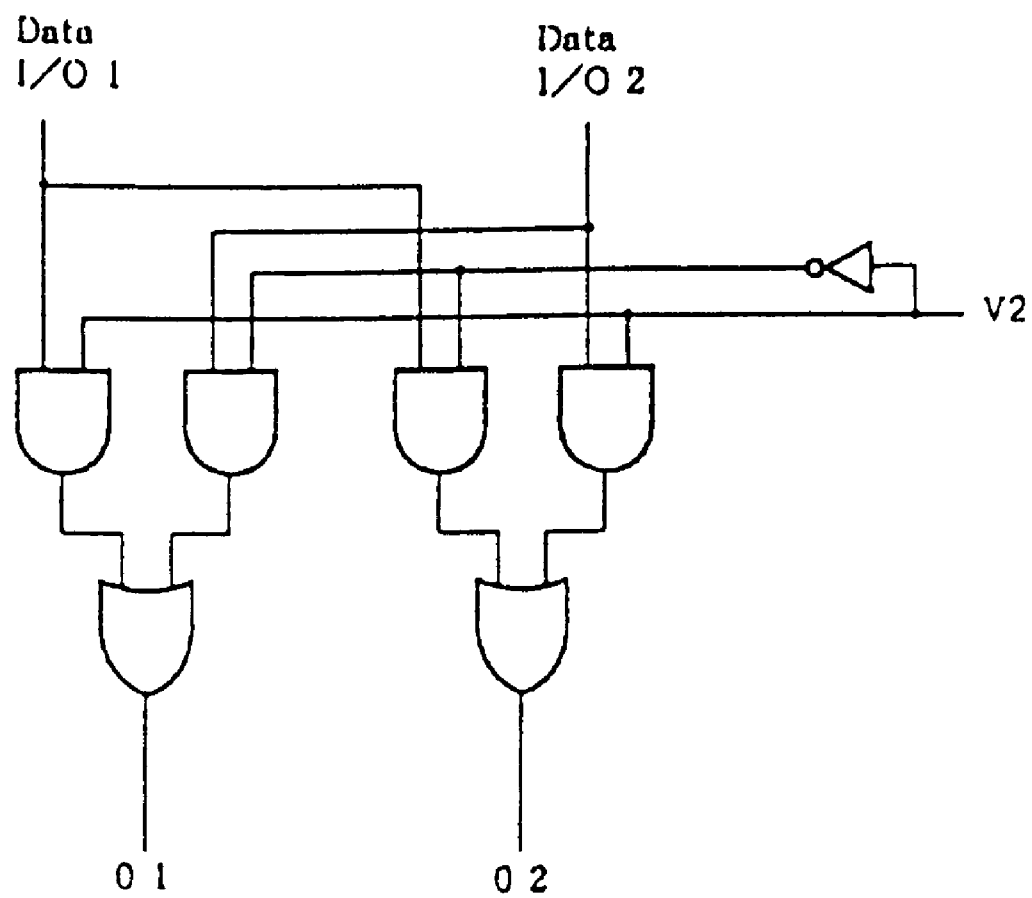
FIG. 7 is a diagram showing an example of a data I/O line changeover circuit appropriate for addition to the circuit of FIG. 3.

Specifically, when signals V1 and V2 are 0, and when V1=0 and V2=1, as shown in FIG. 6 (A), two pixels continuously aligned in the X direction are selected and output via the first data I/O line 21 and second data I/O line 22. Also, when V1=1 and V2=0, as well as when V1 and V2=1, two arbitrary pixels continuously aligned in the Y direction, as shown in FIG. 6 (B), are selected and output.

In addition, in the data output section 10 described above, the positional relationship of the selected two pixels, and the relationship between the signals output to the first data I/O line 21 and second data I/O line 22 changes depending on the upper or lower side or right and left side of the pixel block. Namely, when data of two pixels on the upper side of the pixel block are output, the data of the pixel on the left are output to the first data I/O line 21 and the data of the pixel on the right are output to the second data I/O line 22, and when data of two pixels on the bottom side are output, the data of the pixel on the right are output to the first data I/O line 21 and the data of the pixel on the left are output to the second data I/O line 22.

In the same manner, when data of two pixels on the left side of the pixel block are output, the data of the pixel on the top are output to the first data I/O line 21 and the data of the pixel on the bottom are output to the second data I/O line 22, and when data of two pixels on the right side are output, the data of the pixel on the bottom are output to the first data I/O line 21 and the data of the pixel on the top are output to the second data I/O line 22.

When during subsequent processing, for instance, processing determining the error correction code, a total of the pixel values in columns in a predetermined direction is obtained, in cases in which pixel data should be output, this type of pixel output protocol does not create problems, and it is appropriate because the circuit configuration is simplified.

On the other hand, when obtaining each pixel data element in sequential order is desired there are cases in which subsequent processing may not proceed appropriately using such pixel data output protocol. In such cases, as shown, for instance, in FIG. 7, a data permutation circuit between the first data I/O line 21 and second data I/O line 22 may be added to the data output section 10. In this case, the permutation can be carried out based on only the output pixel selection signal V2, and this type of requirement can be met by using a simple circuit.

Preferred Embodiment 2

In Preferred Embodiment 1, explanations were provided regarding a semiconductor memory capable of arbitrarily reading out two pixel data elements aligned in a desired direction.

The present invention, however, is not limited to two pieces of image data, and the same processing can be carried out with respect to an arbitrary number of pixel data elements.

Thus, in Preferred Embodiment 2, explanations are provided regarding a semiconductor memory capable of reading out four pixel data elements aligned in the X direction and Y direction.

Figure 8:
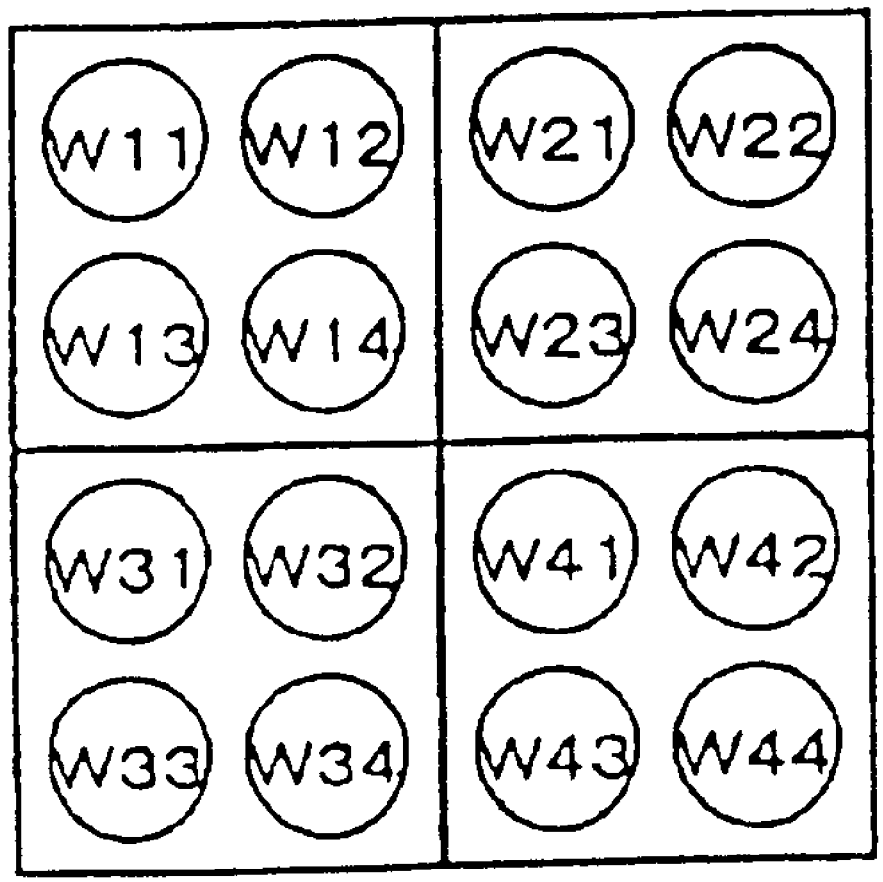
FIG. 8 is a diagram used for the explanation of an image [sic] block of image data stored in the semiconductor memory of Preferred Embodiment 2 of the present invention.

When four pixel data elements are read out in an arbitrary direction, as shown in FIG. 8, four pixel blocks of 2×2 pixels shown in Preferred Embodiment 1 are put together, and two pixel blocks of the four pixel blocks are appropriately selected as new output pixel selection signals V3 and V4.

Figure 9:
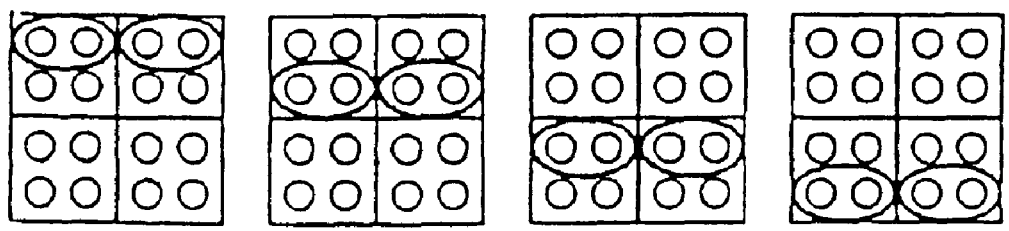
FIG. 9 is a diagram showing the relationship between output pixel selection signals V1–V4 and the selected pixel data.
Figure 9:
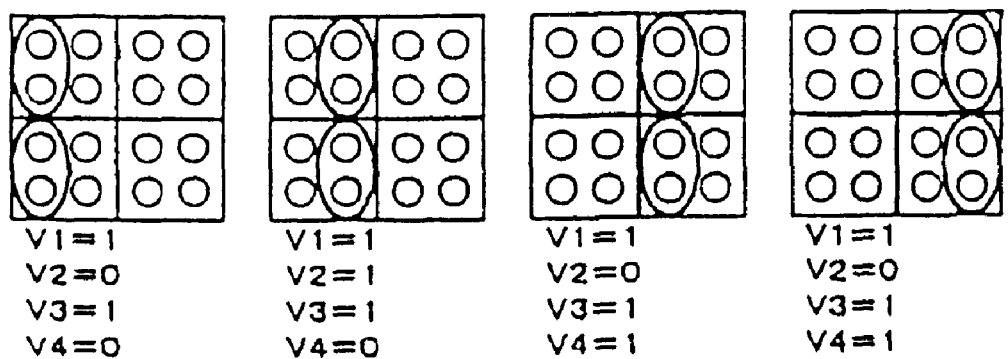

Namely, eight types of data combinations, in which four pixels are aligned in the X direction and Y direction, can be selected, as shown in FIG. 9, by appropriately selecting two pixel blocks and two pixel data elements in these two pixel blocks.

The method for selecting two pixel data elements in each pixel block may be exactly the same method as in the above-described Preferred Embodiment 1, and the same output selection signals V1 and V2 may be input for all of the pixel blocks.

The method for selecting two pixel blocks from the four pixel blocks can be realized based on exactly the same method as the method for the selection of two data elements in Preferred Embodiment 1 if each pixel block is considered a single data element.

Figure 10:
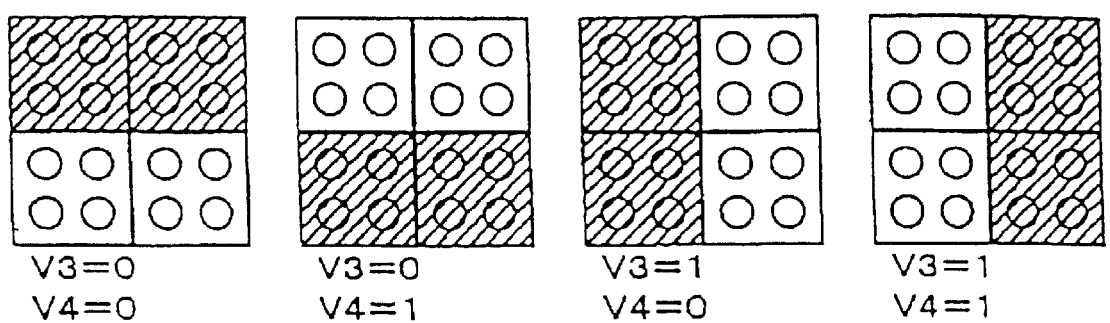
FIG. 10 is a diagram used for the explanation of a method of selection of a pixel block of 2×2 pixels used in order to extract pixel data of four continuously aligned pixels from a pixel block of 4×4 pixels.

Namely, as shown in FIG. 10, four ways whereby two pixel blocks aligned in the X direction and Y direction are selected from the four pixel blocks can be designated by using the new output pixel selection signals V3 and V4.

Figure 11:
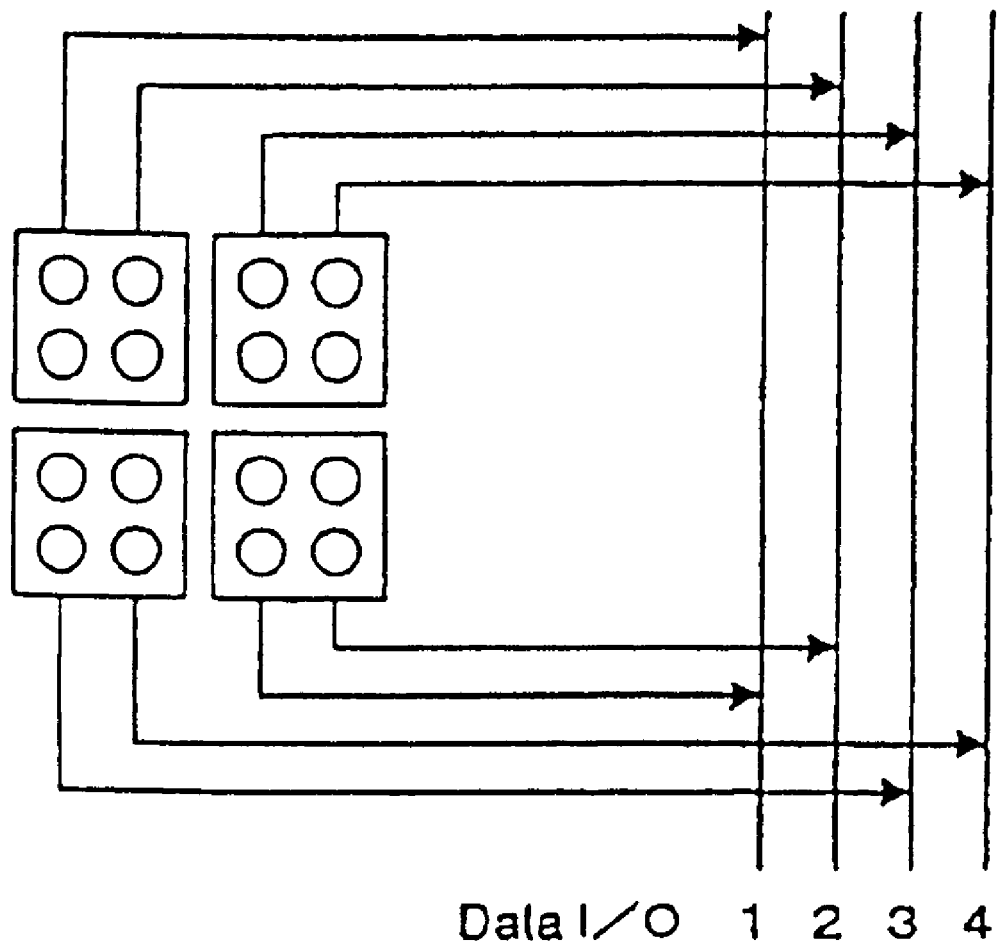
FIG. 11 is a diagram used for the explanation of a method of connection of pixel blocks to data I/O lines in the data output section of the semiconductor memory of Preferred Embodiment 2.

Also, because in Preferred Embodiment 2 four pixel data elements are read out simultaneously, the I/O data lines now have 4-bit=4 pixels, that is, a 16-bit width. If a data line for 4 bits is considered a single data line, then there are four I/O data lines. Then, because among the four pixel blocks, the blocks which are in diagonally opposite corners are not simultaneously accessed, as shown in FIG. 11, common data lines can be used for such pixel blocks in diagonally opposite corners.

The semiconductor memory of Preferred Embodiment 2 can be easily realized by extending the semiconductor memory of Preferred Embodiment 1 in this manner.

Figure 12:
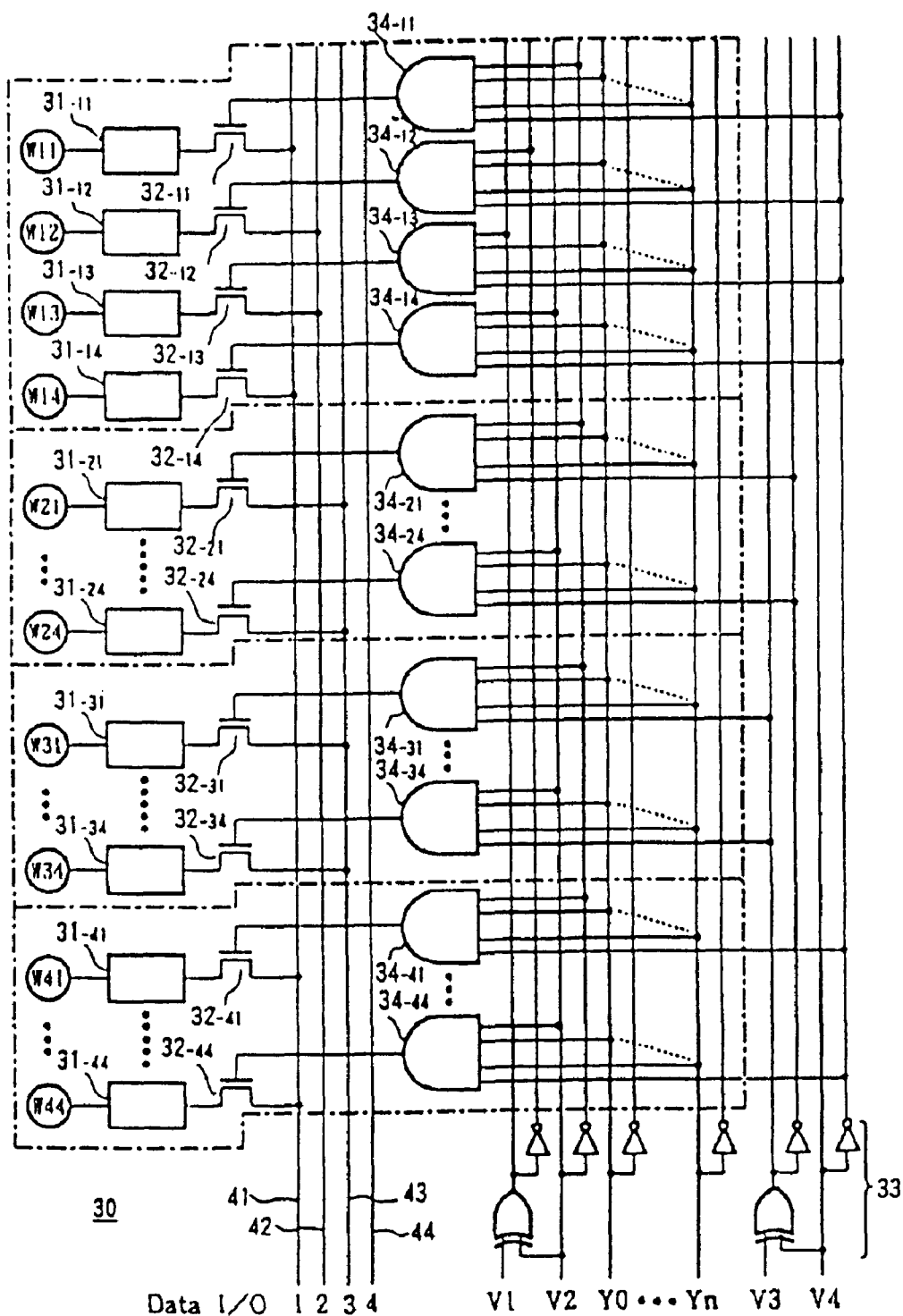
FIG. 12 is a circuit diagram showing the configuration of the data output section of the semiconductor memory of Preferred Embodiment 2 of the present invention.

A specific example of the circuitry of data output section 30 of the semiconductor memory of Preferred Embodiment 2 is shown in FIG. 12.

In this type of semiconductor memory, by inputting page addresses, pixel data are read out from predetermined sub-blocks, and input to sense amps $31_{-1}$–$31_{-44}$.

Also, at such time, signals Y0–Yn in the upper portion of the page address, as well as output pixel selection signals V1–V4 are input to the data output section 30. Then, AND elements $34_{-11}$–$34_{-44}$ are actuated when signals of pixel data W11–W44 are output based on the upper portion of the page address. Also, based on the output pixel selection signals V1–V4, via a group of logic elements 33 and AND elements $34_{-11-34-44}$, the desired four pixel data elements shown in FIG. 9 are selected and output to the first-fourth data I/O lines 41–44.

In addition, the present invention is not limited to the present embodiments, and permits various modifications.

For instance, although in the above-described Preferred Embodiment 1 and Preferred Embodiment 2, pixel data elements were each composed of 4-bit data, they can be 1-bit, 2-bit, 8-bit data and the like, with the number of bits allocated to a single pixel data element being arbitrary.

Also, in the embodiments, the physical memory map configuration of the semiconductor memory is arbitrary, and is not restricted in any way.

If the semiconductor memory device of the present invention is used, then, when storing data having a two-dimensional structure, such as when each data element is specified by a position in the X and Y directions, data continuously aligned in the X direction and Y direction can be accessed efficiently and rapidly, and, furthermore, data can be read out at a speed that is substantially several times greater than the speed of data input. As a result, a semiconductor memory device can be provided, in which [sic] correction code generation processing and such on stored image data can be carried out efficiently.

I claim:

1. A semiconductor memory device comprising:
   a storage means for storing data having a two-dimensional structure, in which each data element is specified by a position in a first direction and a position in a second direction, and
   an output means for substantially simultaneously reading out and outputting a plurality of predetermined data elements aligned in a predetermined one of the first direction or the second direction determined by a control signal, from the stored data having a two-dimensional structure.

2. The semiconductor memory device according to claim 1 wherein:
   the storage means stores the data having a two-dimensional structure so that they can be simultaneously read in N blocks having N×N data elements in the first direction and the second direction,
   with the output means comprising:
      a block designation means for designating the desired blocks in the stored data having a two-dimensional structure,
      a data reproduction means for reproducing N×N data elements of the designated blocks,
      a data designation means for designating N data elements of a single type in N data elements of 2×N types aligned in the first direction or second direction which are contained in the read-out blocks,
      a data selection means for selecting the designated N data elements in the read-out N×N data elements, and
      an N data output means for outputting the selected N data elements.

3. The semiconductor memory device according to claim 2 wherein:
   the data selection means comprises
   an N×N output control means provided for each of the reproduced N×N data elements, connected to each of the N data output means in such a manner that all of the data that are not in the same column in the first direction and the second direction are all connected to the same data output means, and the control means controls the output of each of the reproduced data elements,
   wherein the output control means, which corresponds to the designated N data elements, selects the designated N data elements from the read-out N×N data elements by outputting the corresponding data to the connected data output means.

4. The semiconductor memory device according to claim 2 wherein:

data selection means comprises:

an N×N control means for each of the reproduced N×N data elements and that controls the output of reproduced data based on the designation of the output N data elements, and a data switching means for arranging the N data elements selectively output from the N×N control means for generating data in a mutually predetermined positional relationship with respect to the first direction and the second direction and that outputs the data the N data output means.

5. The semiconductor memory device according to claim 1 wherein:

the data are represented by a predetermined number of bits.

6. The semiconductor memory device according to claim 1 wherein:

the data having a two-dimensional structure are image data, and the data elements are pixel data of the image data.

7. The semiconductor memory device according to claim 2 wherein:

the data are represented by a predetermined number of bits.

8. The semiconductor memory device according to claim 3 wherein:

the data are represented by a predetermined number of bits.

9. The semiconductor memory device according to claim 4 wherein:

the data are represented by a predetermined number of bits.

10. The semiconductor memory device according to claim 2 wherein:

the data having a two-dimensional structure are image data, and the data elements are pixel data of the image data.

11. The semiconductor memory device according to claim 3 wherein:

the data having a two-dimensional structure are image data, and the data elements are pixel data of the image data.

12. The semiconductor memory device according to claim 4 wherein:

the data having a two-dimensional structure are image data, and the data elements are pixel data of the image data.

13. The semiconductor memory device according to claim 5 wherein:

the data having a two-dimensional structure are image data, and the data elements are pixel data of the image data.

* * * * *